(12) United States Patent
Oishi et al.

(10) Patent No.: US 6,972,966 B1
(45) Date of Patent: Dec. 6, 2005

(54) COMPOSITE FLEXIBLE WIRING BOARD, METHOD OF MANUFACTURING THE SAME, ELECTRO-OPTICAL DEVICE, AND ELECTRONIC EQUIPMENT

(75) Inventors: Eiji Oishi, Nagano-ken (JP); Kogo Endo, Chino (JP)

(73) Assignee: Seiko Epson Corporation, (JP)

( * ) Notice: Subject to any disclaimer, the term of this patent is extended or adjusted under 35 U.S.C. 154(b) by 1141 days.

(21) Appl. No.: 09/661,187

(22) Filed: Sep. 13, 2000

(30) Foreign Application Priority Data

Sep. 14, 1999 (JP) ................................ 11-260536
Sep. 8, 2000 (JP) ............................. 2000-272684

(51) Int. Cl.[7] ............................ H05K 1/11; H05K 1/14
(52) U.S. Cl. ...................... 361/803; 361/804; 174/250; 349/150
(58) Field of Search ................................ 174/250, 254, 174/200; 361/149–152, 749–751, 760–766, 361/803, 804; 349/150

(56) References Cited

U.S. PATENT DOCUMENTS

| | | | |
|---|---|---|---|
| 5,668,700 A * | 9/1997 | Tagusa et al. ............... | 361/779 |
| 5,719,749 A * | 2/1998 | Stopperan .................... | 361/769 |
| 5,727,310 A | 3/1998 | Casson et al. | |
| 5,880,935 A | 3/1999 | Wiesa et al. | |
| 6,005,645 A * | 12/1999 | Hirakata et al. ............... | 349/15 |
| 6,507,384 B1 * | 1/2003 | Endo et al. .................. | 349/149 |

FOREIGN PATENT DOCUMENTS

| | | |
|---|---|---|
| JP | 02253591 | 10/1990 |
| JP | 06202135 | 7/1994 |
| JP | 7-199219 | 8/1995 |
| JP | 7-270814 | 10/1995 |
| JP | 09232377 | 9/1997 |
| JP | 09318965 | 12/1997 |
| JP | 09331143 | 12/1997 |

OTHER PUBLICATIONS

Corresponding European Patent Application No. 00307782.3 Search Report.

* cited by examiner

*Primary Examiner*—Kamand Cuneo
*Assistant Examiner*—Yuriy Semenenko
(74) *Attorney, Agent, or Firm*—Harness, Dickey & Pierce, P.L.C.

(57) ABSTRACT

A composite flexible wiring board comprises a first flexible wiring board and a second flexible wiring board on which a surface-mounted part is provided. The second flexible wiring board is disposed on the first flexible wiring board in its predetermined area. The first flexible wiring board and the second flexible wiring board are electrically connected to each other through an interlayer contact portion provided in a predetermined position. The first flexible wiring board has an input terminal region and an output terminal region with a power IC chip mounted on the first flexible wiring board.

8 Claims, 14 Drawing Sheets

Fig. 13
(A)
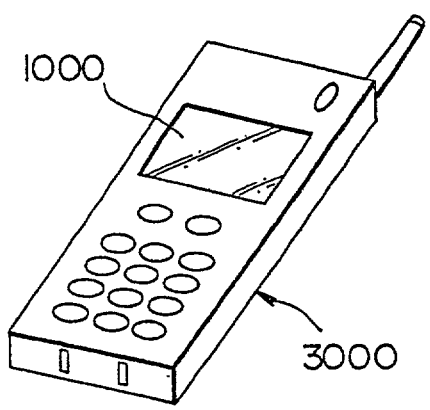
(B)
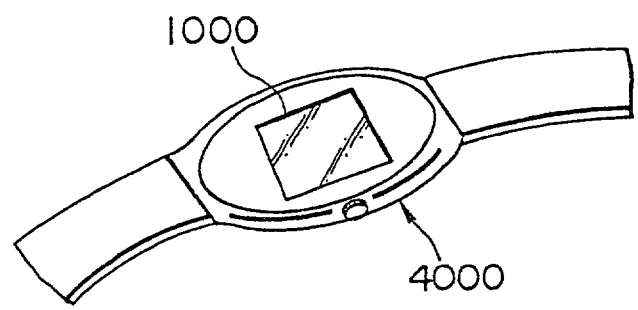
(C)
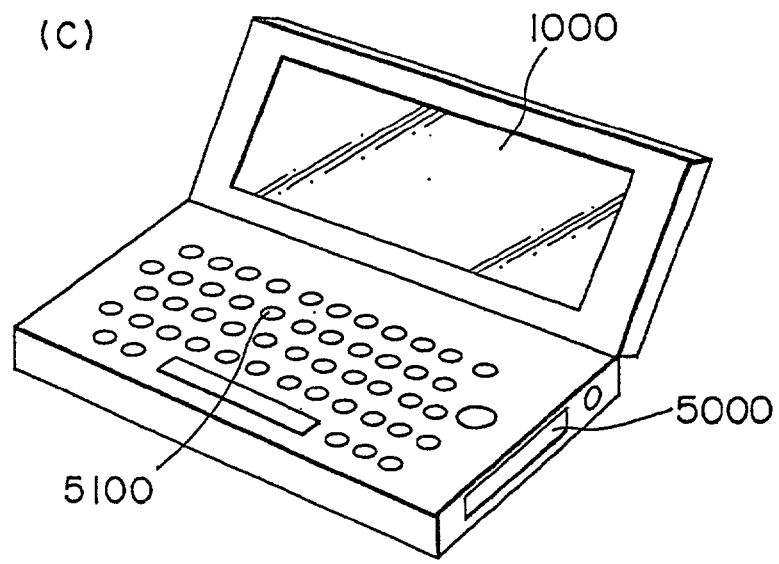

COMPOSITE FLEXIBLE WIRING BOARD, METHOD OF MANUFACTURING THE SAME, ELECTRO-OPTICAL DEVICE, AND ELECTRONIC EQUIPMENT

BACKGROUND OF THE INVENTION

1. Technical Field of the Invention

The present invention relates to a composite flexible wiring board including a flexible wiring board on which surface-mounted parts are disposed, and a method of manufacturing the composite flexible wiring board. The present invention also relates to an electro-optical device and electronic equipment to which the composite flexible wiring board is applied.

2. Description of the Related Art

Recently, display devices have been widely employed as information display terminals in portable equipment, homes, offices and factories, automobiles, etc. In particular, liquid crystal display devices have advantageous features such as thin thickness, light weight, low voltage, and low power consumption. Liquid crystal display devices are primary units of, e.g., electronic displays and have been increasingly applied to PDAs (Personal Digital Assistants), etc. by utilizing the feature of low power consumption.

As one of conventional liquid crystal display devices, FIG. 14 shows a liquid crystal display device 1 of, for example, the passive matrix addressing type or the active matrix addressing type employing, as switching devices, 2-terminal nonlinear devices such as TFDs (Thin Film Diodes). The liquid crystal display device 1 comprises a liquid crystal display panel 2 and a printed board 3. The liquid crystal display panel 2 and the printed board 3 are electrically connected to each other via first and second flexible wiring boards 4, 5.

The liquid crystal display panel 2 comprises a pair of glass substrates 6, 7 arranged in opposite relation to face each other. A sealing material (not shown) is interposed between the glass substrates 6, 7 to surround a display area. A liquid crystal is sealed off in a gap defined by the glass substrates 6, 7 and the sealing material. A plurality of signal electrodes 8 are formed in parallel on one surface of the glass substrate 6 facing the glass substrate 7 (referred to as an "opposing surface of the glass substrate 6"). On one surface of the glass substrate 7 facing the glass substrate 6 (referred to as an "opposing surface of the glass substrate 7"), a plurality of scanning electrodes 9 are formed to extend in a direction perpendicular to the signal electrodes 8.

In one predetermined side edge (lower side edge in FIG. 14) of the liquid crystal display panel 2, an edge portion of the glass substrate 6 is projected outward (downward in FIG. 14) of a corresponding edge portion of the glass substrate 7, and the projected portion (region where the glass substrate 6 and the glass substrate 7 are not superimposed) constitutes a wiring junction region 6A. Also, in another side edge (left side edge in FIG. 14) of the liquid crystal display panel 2 which is adjacent to the above one side edge, an edge portion of the glass substrate 7 is projected outward (leftward in FIG. 14) of a corresponding edge portion of the glass substrate 6, and the projected portion constitutes a wiring junction region 7A. Signal driver IC chips 80A, 80B are mounted in the wiring junction region 6A of the glass substrate 6 by the COG (Chip On Glass) technology. These signal driver IC chips 80A, 80B are connected to output terminals 8A up to which ends of the plurality of signal electrodes 8 are extended, and also to input terminals 810 arrayed along a long edge of the wiring junction region 6A.

Further, a scanning driver IC chip 90 is mounted in the wiring junction region 7A of the glass substrate 7 by the COG technology. The scanning driver IC chip 90 is connected to output terminals 9A up to which ends of the plurality of scanning electrodes 9 are extended, and also to input terminals 910 arrayed along a long edge of the wiring junction region 7A.

An output terminal section 4A of the first flexible wiring board 4 is joined through an anisotropic conductive film (ACF) to the plurality of input terminals 810 arrayed along the long edge of the wiring junction region 6A of the glass substrate 6 for electrical connection therebetween. Likewise, an output terminal section 5A of the second flexible wiring board 5 is joined through an anisotropic conductive film to the plurality of input terminals 910 arrayed along the long edge of the wiring junction region 7A of the glass substrate 7. Further, an input terminal section 4B of the first flexible wiring board 4 is joined to an output terminal section 3A formed on the printed board 3 through an anisotropic conductive film or a connector. An input terminal section 5B of the second flexible wiring board 5 is joined to an output terminal section 3B formed on the printed board 3 through an anisotropic conductive film or a connector. Additionally, on the printed board 3, a predetermined wiring is formed and various electronic parts for controlling and operating the liquid crystal display panel 2 are mounted.

One known example of electronic equipment using the liquid crystal display device having the above-described construction includes an input unit such as a keyboard or a ten-key numerical pad, and displays data on the liquid crystal display panel in accordance with an input operation made on the input unit. In such an example of electronic equipment, the liquid crystal display panel and the printed board are assembled in a chassis (panel accommodating frame). On that occasion, the two flexible wiring boards are bent so that the printed board is arranged on the rear side of the liquid crystal display panel.

In the liquid crystal display device described above, however, because the printed board 3 as a control circuit board is arranged on the rear side of the liquid crystal display panel 2, the overall thickness of the liquid crystal display device and the thickness of a display unit of the electronic equipment are increased. Thus, the presence of the printed board 3 has impeded a reduction in weight and thickness of the liquid crystal display device and the electronic equipment. There is a demand for reducing the thickness of a housing down to an allowable limit value particularly in the field of portable information equipment such as cellular phones and pocket-size personal computers developed with primary importance placed on portability.

The above problem of an increased thickness due to the presence of a control circuit board is not limited to liquid crystal display devices of the passive matrix addressing type or the active matrix addressing type employing 2-terminal nonlinear devices, but it is similarly encountered in other various display devices such as liquid crystal display devices of the active matrix addressing type employing a thin film transistors (TFT) for each of pixels and electroluminescent (EL) display devices. In other words, from the viewpoints of portability and carryability, a reduction in size and weight is demanded in various electro-optical devices including liquid crystal display devices. Corresponding to such a trend, it has become more important how to mount electronic parts used for operating an electro-optical device within respective limits of size and weight with a density as high as possible.

An object of the present invention is to provide a composite flexible wiring board including surface-mounted parts and being able to constitute a hybrid IC, and a method of manufacturing the composite flexible wiring board.

Another object of the present invention is to provide an electro-optical device and electronic equipment, which employ the composite flexible wiring board according to the present invention, and which can achieve a reduction in size and weight.

SUMMARY OF THE INVENTION

A composite flexible wiring board according to the present invention comprises a first flexible wiring board and a second flexible wiring board on which a surface-mounted part is mounted, the second flexible wiring board being provided on the first flexible wiring board in a predetermined area thereof, the first flexible wiring board and the second flexible wiring board being electrically connected to each other through an interlayer contact portion provided in a predetermined position.

The composite flexible wiring board set forth above has the working advantages as follows.

(a) Since the first and second flexible wiring boards are joined to each other in superimposed relation, wiring layers and electronic parts can be distributed to the two flexible wiring boards. Accordingly, a packing density per unit area of the composite flexible wiring board can be increased, thus resulting in higher flexibility in design.

(b) Since the packing density is increased by arranging the two flexible wiring boards in superimposed relation as described above, the board area can be much reduced in comparison with the case of forming an identical electrical circuit on a single flexible wiring board.

(c) Since the composite flexible wiring board includes the second flexible wiring board on which the surface-mounted part is provided, it can not only provide a function of a simple wiring board, but also constitute a hybrid IC, including addition of a control circuit function, a power-supply control circuit function, a boosting circuit function, a DC/DC converter, etc. By so incorporating those control functions, for example, in the composite flexible wiring board, a large-sized, heavy and rigid control board is no longer required. It is hence possible to achieve a reduction in size and weight of electro-optical devices and electronic equipment, which employ the composite flexible wiring board.

(d) Since the first and second flexible wiring boards can be formed in separate steps, restrictions imposed by the conditions of the connecting step are reduced. For example, a processing temperature differs depending on the connecting method such that a temperature in the range of about 200–260° C. is required when solder is used for electrical connection, and a temperature in the range of about 190–210° C. is required when an anisotropic conductive film is used for electrical connection. When different connecting methods are used for the first and second flexible wiring boards, appropriate temperatures can be separately employed for the respective boards.

Moreover, the second flexible wiring board on which the surface-mounted part is provided can be handled as a component to be purchased from the outside. In this case, there is no need of installing the equipment, etc. related to mounting of the surface-mounted part.

The composite flexible wiring board according to the present invention can be implemented in the following forms.

(1) The second flexible wiring board is preferably arranged on a part of the first flexible wiring board. With this construction, the composite flexible wiring board can be easily manufactured by placing and fixing the second flexible wiring board onto the predetermined area of the first flexible wiring board.

(2) The first flexible wiring board preferably mounts at least a power IC chip thereon. With this construction, a control circuit can be constructed by a single composite flexible wiring board. Electronic parts for constructing the control circuit may include, in addition to the power IC chip, a flat-packaged LSI, a resistor, a capacitor, an inductance, a diode, a transistor, a connector, a quartz oscillator, etc. as needed. The power IC chip can be connected to an conductive layer of the first flexible wiring board through an anisotropic conductive film.

(3) The first flexible wiring board preferably has an input terminal region and an output terminal region. This construction makes the composite flexible wiring board more easily adapted for various types of electro-optical devices.

(4) The second flexible wiring board may include at least one kind of surface-mounted part selected from among a flat-packaged LSI, a resistor, a capacitor, an inductance, a diode, a transistor, a quartz oscillator, and a connector. The kind of surface-mounted part selected is determined depending on the circuit formed on the composite flexible wiring board. The surface-mounted part can be connected to an conductive layer of the second flexible wiring board through a solder layer or an anisotropic conductive film.

(5) The interlayer contact portion can be constituted by an anisotropic conductive film or solder. Taking into account that an anisotropic conductive film is used for connecting the power IC chip, the interlayer contact portion is preferably constituted by an anisotropic conductive film. In this case, since the first flexible wiring board is not subjected to reflow soldering, it is possible to avoid a drawback caused by a deformation, such as a warp, of the flexible wiring board under heating. As another advantage, the flexibility in design can be increased because no restrictions are imposed on layout from the viewpoint of preventing interference with the mount area of the power IC chip when a solder cream for the surface-mounted part is printed on the flexible wiring board.

(6) The composite flexible wiring board may further comprise another flexible wiring board connected to the first flexible wiring board, the another first flexible wiring board having an output terminal region. With this construction, since electrical connection to two different terminal regions of a device as a connection target (electro-optical device) can be made by using a single composite flexible wiring board, the number of components of the composite flexible wiring board can be reduced.

A method of manufacturing a composite flexible wiring board according to the present invention comprises the steps of:

forming each of first and second flexible wiring boards; and electrically connecting the first and second flexible wiring boards to each other through an interlayer contact portion.

With the manufacturing method set forth above, the first and second flexible wiring boards are properly positioned with an conductive member placed between both the properly positioned boards, whereby the first and second flexible wiring boards can be joined to each other through the conductive member while an interlayer contact portion is formed. Furthermore, as described above, the area of the composite flexible wiring board according to the present invention can be relatively reduced in comparison with the case of employing a single flexible wiring board. As a result, the composite flexible wiring board can be easily manufactured with high efficiency.

The interlayer contact portion can be easily formed at a comparably low temperature by, for example, joining the first and second flexible wiring boards under thermal pressing with an anisotropic conductive film interposed between both the boards.

An electro-optical device according to the present invention comprises an electro-optical panel including at least one substrate,
  the substrate having a wiring junction region,
  the wiring junction region being connected to a composite flexible wiring board according to any of the above.

The electro-optical panel may include a first substrate and a second substrate arranged in opposite relation to face each other,
  the first substrate having a wiring junction region not superimposed with the second substrate.

A liquid crystal layer, for example, may be disposed as an electro-optical material layer between the first substrate and the second substrate.

Further, the electro-optical panel may be an EL display panel including, as an electro-optical material layer, an electroluminescence structure formed on the substrate.

Electronic equipment according to the present invention each includes the electro-optical device according to the present invention.

The electro-optical device and the electronic equipment according to the present invention each include the composite flexible wiring board according to the present invention, and hence can be reduced in size and weight as a result of the working advantages obtainable with the composite flexible wiring board.

BRIEF DESCRIPTION OF THE DRAWINGS

FIG. 12 is a perspective view showing a digital still camera as one example of electronic equipment according to a seventh embodiment of the present invention.

FIGS. 13(A) to 13(C) show application examples of electronic equipment according to the seventh embodiment of the present invention; FIG. 13(A) shows a cellular phone, FIG. 13(B) shows a wristwatch, and FIG. 13(C) shows a portable information tool.

DETAILED DESCRIPTION OF THE PREFERRED EMBODIMENTS

Examples of a composite flexible wiring board, an electro-optical device and electronic equipment according to the present invention will be described below with reference to the drawings.

Figure 1:
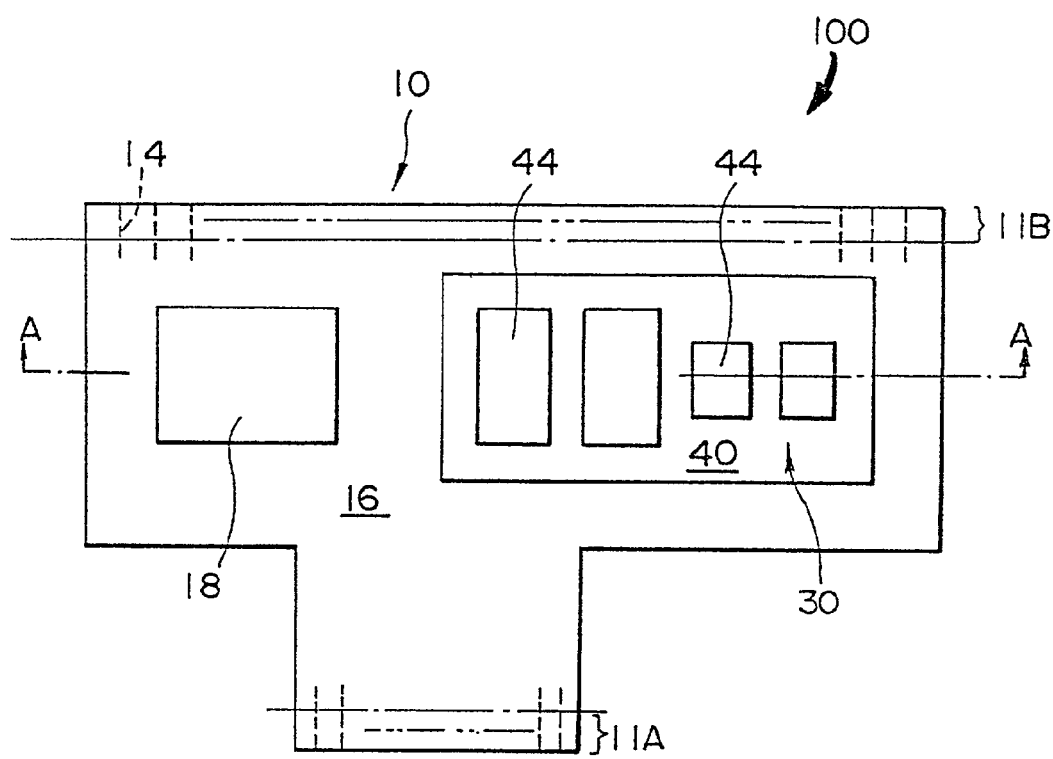
FIG. 1 is a plan view schematically showing a composite flexible wiring board according to a first embodiment of the present invention.
Figure 2:
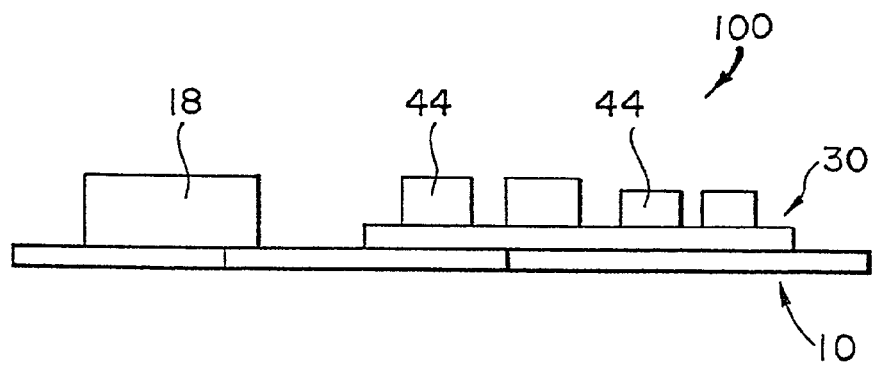
FIG. 2 is a side view of the composite flexible wiring board shown in FIG. 1.
Figure 3:
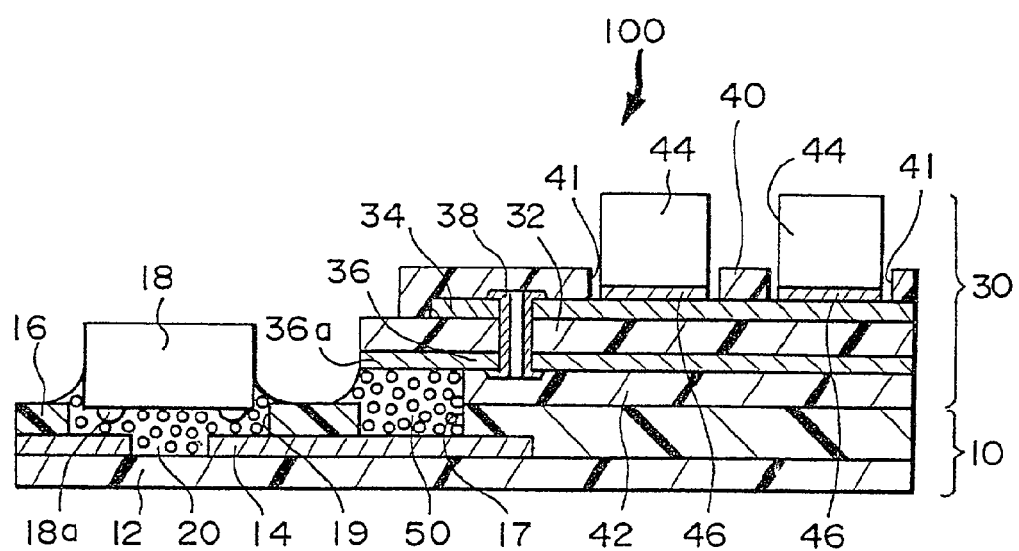
FIG. 3 is a schematic sectional view taken along line A—A in FIG. 1.

FIG. 1 is a plan view schematically showing one example of a composite flexible wiring board 100 according to the present invention, FIG. 2 is a side view of the composite flexible wiring board 100, and FIG. 3 is an enlarged schematic sectional view taken along line A—A in FIG. 1. Note that, in FIGS. 1 and 2, wiring patterns and a layered structure of each board are omitted.

The composite flexible wiring board 100 comprises a first flexible wiring board 10 and a second flexible wiring board 30. The second flexible wiring board 30 is joined to a predetermined region of the surface of the first flexible wiring board 10.

Initially, the first flexible wiring board 10 will be described.

As shown in FIGS. 1 and 2, the first flexible wiring board 10 has the same planar shape as the overall planar shape of the composite flexible wiring board 100. The first flexible wiring board 10 is constructed by a single-sided flexible board, and has an input terminal region 11A and an output terminal region 11B having a greater width than the input terminal region 11A. Further, a power IC chip 18 is mounted on the first flexible wiring board 10.

The first flexible wiring board 10 comprises, as shown in FIG. 3, a base 12 being dielectric and flexible, and a wiring layer 14 having a predetermined pattern and formed on the base 12. An insulating layer 16 is also formed on the base 12 so as to cover the wiring layer 14. Further, in predetermined areas of the insulating layer 16, holes are formed for constituting contact portions. The holes include, for example, a hole 17 that serves as an interlayer contact portion 50 for electrical connection to the second flexible wiring board 30, and a hole 19 through which the power IC chip 18 is mounted. Those holes 17 and 19 are formed by removing respective parts of the insulating layer 16 with the photolithographic technology, for example, such that corresponding parts of the wiring layer 14 are exposed. The power IC chip 18 has bumps 18a formed on its underside and is electrically connected to the wiring layer 14 through an anisotropic conductive layer 20.

The base 12 can be made of suitable one of generally used resins such as polyimide. Also, the insulating layer 16 can be made of suitable one of resins that are generally used to serve as resists capable of being processed by the photolithography for patterning. Those materials of the base and the insulating layer are similarly employed for the flexible wiring board described below.

Next, the second flexible wiring board 30 will be described below.

The second flexible wiring board 30 is constructed by a double-sided flexible board, and comprises a base 32 being dielectric and flexible, an upper wiring layer 34 having a predetermined pattern and formed on an upper surface of the base 32, and a lower wiring layer 36 having a predetermined pattern and formed on a lower surface of the base 32. Also, an upper insulating layer 40 is formed on the upper surface of the base 32 so as to cover the upper wiring layer 34, and a lower insulating layer 42 is formed on the lower surface of the base 32 so as to cover the lower wiring layer 36. The upper wiring layer 34 and the lower wiring layer 36 are electrically connected to each other by a contact portion 38, which is constituted as a through hole, for example, formed in a predetermined position.

Further, in predetermined areas of the lower insulating layer 42, holes (not shown) are formed for constituting interlayer contact portions. The holes are formed by removing respective parts of the lower insulating layer 42 such that corresponding parts of the lower wiring layer 36 are exposed. Moreover, in an area of the lower insulating layer 42 where the interlayer contact portion 50 shown in FIG. 3 is formed, the lower insulating layer 42 is removed and a terminal portion 36*a* is formed by an exposed lower surface of the lower wiring layer 36.

In addition, mount holes 41 are formed in the upper insulating layer 40 by removing predetermined areas thereof such that corresponding parts of the upper wiring layer 34 are exposed. Various surface-mounted parts 44, such as a flat-packaged LSI and chip parts (e.g., resistors, capacitors, inductances, diodes, transistors, quartz oscillators, and connectors), are mounted in the mount holes 41. The surface-mounted parts 44 are electrically connected to the upper wiring layer 34 through solder layers 46, for example.

The first flexible wiring board 10 and the second flexible wiring board 30 are connected to each other in a predetermined area through an interlayer contact portion formed of, e.g., an anisotropic conductive layer and a solder layer. In the example shown in FIG. 3, the wiring layer 14 of the first flexible wiring board 10 and the terminal portion 36*a* of the second flexible wiring board 30 are electrically connected to each other through the interlayer contact portion 50 formed of an anisotropic conductive layer.

The anisotropic conductive layer can be formed by using an anisotropic conductive film (ACF). In other words, conductive particles are dispersed in a high-molecular layer of a resin, elastomer or the like, and serve to establish electrical connection.

The working advantages of the composite flexible wiring board 100 will now be described.

(a) Since the first and second flexible wiring boards 10, 30 are joined to each other in superimposed relation, the wiring layers and the electronic parts can be distributed to the two flexible wiring boards 10, 30. Accordingly, a packing density per unit area of the composite flexible wiring board 100 can be increased, thus resulting in higher flexibility in design.

(b) Since the packing density is increased by arranging the two flexible wiring boards 10, 30 in superimposed relation as described above, the board area can be much reduced in comparison with the case of forming an identical electrical circuit on a single flexible wiring board.

(c) Since the composite flexible wiring board 100 includes the second flexible wiring board 30 on which the surface-mounted parts 44 are disposed, it can not only provide a function of a simple wiring board, but also constitute a hybrid IC, including addition of a control circuit function, a power-supply control circuit function, a boosting circuit function, a DC/DC converter, etc. By so incorporating those control functions in the composite flexible wiring board 100, a large-sized, heavy and rigid control board is no longer required. It is hence possible to achieve a reduction in size and weight of electro-optical devices and electronic equipment, which employ the composite flexible wiring board 100.

(d) Since the first and second flexible wiring boards 10, 30 can be formed in separate steps, restrictions imposed by the conditions of the connecting step are reduced. For example, a processing temperature differs depending on the connecting method such that a temperature in the range of about 200–260° C. is required when solder is used for electrical connection, and a temperature in the range of about 190–210° C. is required when an anisotropic conductive film is used for electrical connection. When different connecting methods are used for the first and second flexible wiring boards, appropriate temperatures can be separately employed for the respective boards. More specifically, in this embodiment, the mounted part is connected in the first flexible wiring board 10 by using an anisotropic conductive film and in the second flexible wiring board 30 by using solder. However, the mounted parts are connected in separate steps carried out for each of the first and second flexible wiring boards. As a result, for example, the temperature in the connecting step for the second flexible wiring board 30 will not adversely affect the first flexible wiring board 10.

Figure 4:
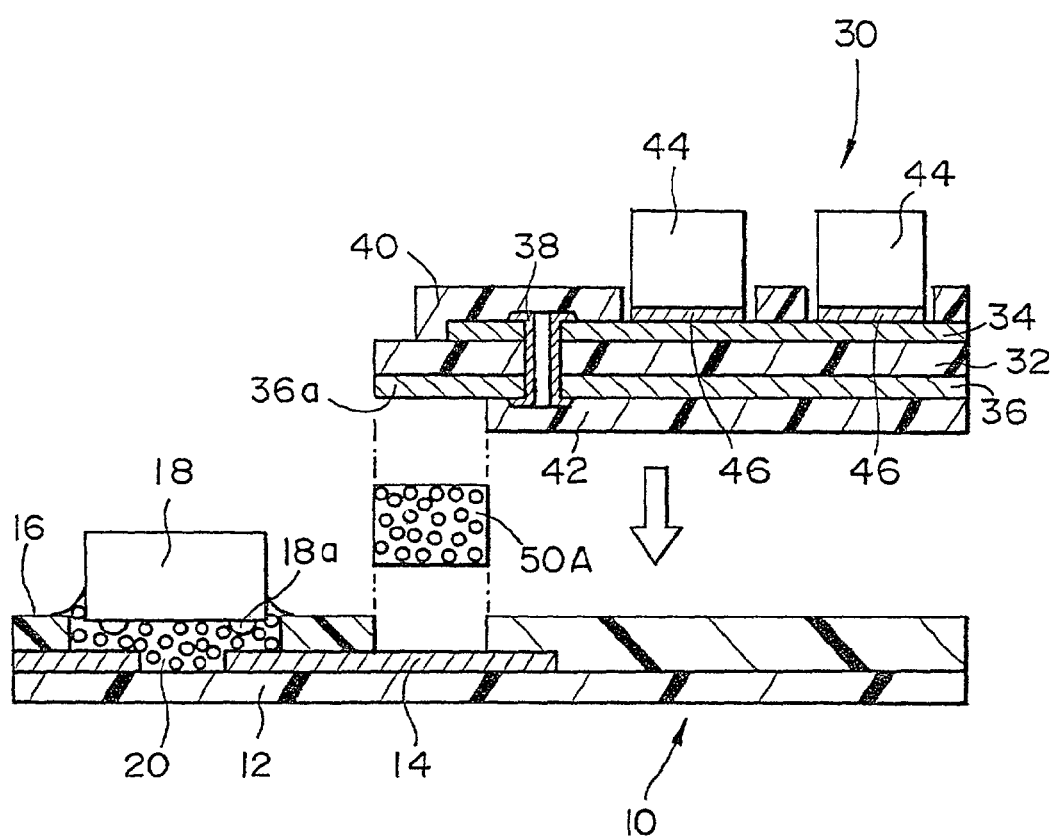
FIG. 4 is a sectional view schematically showing a manufacturing step of the composite flexible wiring board according to the first embodiment of the present invention.

One example of manufacturing of the composite flexible wiring board 100 will be described below with reference to FIG. 4.

Initially, the first flexible wiring board 10 including the wiring layer 14 of the predetermined pattern, the power IC chip 18, and other electronic parts, which are provided as needed, is fabricated by a known method beforehand. Likewise, the second flexible wiring board 30 including the wiring layer 34, 36 of the predetermined patterns, the surface-mounted parts 44, the contact portion 38, the terminal portion 36*a*, etc. is fabricated by a known method beforehand.

In this embodiment, electronic parts such as the power IC chip 18 are connected through the anisotropic conductive layer 20 in the first flexible wiring board 10. Accordingly, the connecting step is performed at a comparatively low temperature in the range of 190–210° C., for example, when the electronic parts are mounted on the first flexible wiring board 10. On the other hand, in the second flexible wiring board 30, the surface-mounted parts 44 are connected through the solder layer 46. Accordingly, the soldering step is performed at a comparatively high temperature in the range of 200–260° C., for example, when those parts are mounted on the second flexible wiring board 30.

Then, the second flexible wiring board 30 is properly positioned on the first flexible wiring board 10 with an anisotropic conductive film 50A interposed therebetween in each of predetermined areas (including at least the area where the interlayer contact portion is to be formed). After that, the first flexible wiring board 10 and the second flexible wiring board 30 are joined to each other under thermal pressing carried out in a predetermined temperature range of 190–210° C., for example, whereby the composite flexible wiring board 100 is formed.

With the manufacturing method described above, an conductive member (i.e., the anisotropic conductive film 50A) is interposed between the first and second flexible wiring boards 10, 30 which are in a properly positioned state, whereby the first and second flexible wiring boards 10, 30 can be jointed to each other while the interlayer contact portion 50 is formed between them. Stated otherwise, according to the manufacturing method of this embodiment, since the first and second flexible wiring boards 10, 30 can be joined to each other through a single step by employing anisotropic conductive film, the composite flexible wiring board can be easily manufactured with high efficiency. Furthermore, as described above, the area of the composite flexible wiring board 100 can be relatively reduced in comparison with the case of employing a single flexible wiring board.

Figure 5:
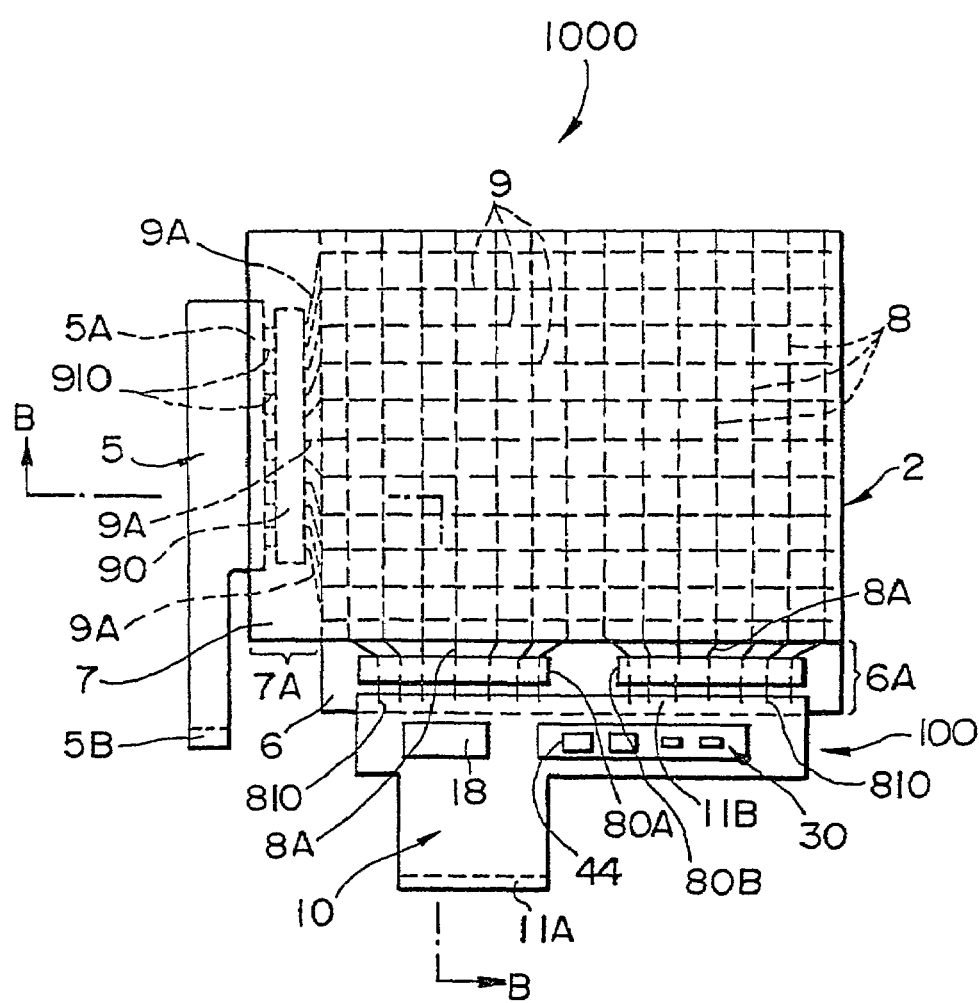
FIG. 5 is a plan view schematically showing a liquid crystal display device as one example of electro-optical devices according to a second embodiment of the present invention.
Figure 6:
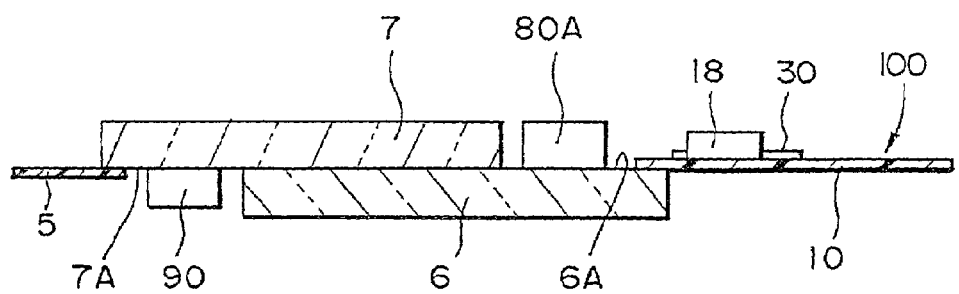
FIG. 6 is a schematic sectional view taken along line B—B in FIG. 5.

In a second embodiment, a description will be made of a liquid crystal display device as one example of electro-optical devices to which the flexible wiring board according to the present invention is applied. FIG. 5 is a plan view schematically showing a liquid crystal display device 1000 according to this embodiment, and FIG. 6 is a schematic sectional view taken along line B—B in FIG. 5.

The liquid crystal display device 1000 is constructed as, for example, a reflective type liquid crystal display device of the passive matrix addressing type. The liquid crystal display device 1000 comprises a liquid crystal display panel 2, a composite flexible wiring board 100 according to the present invention, and a known flexible wiring board 5. In the example shown in FIG. 5, the composite flexible wiring board 100 is the same as that according to the first embodiment. Therefore, components having the same functions as those of the composite flexible wiring board 100 according to the first embodiment are denoted by the same symbols and a detailed description thereof is omitted here.

The liquid crystal display panel 2 comprises a pair of glass substrates 6, 7 arranged in opposite relation to face each other. A sealing material (not shown) is interposed between the glass substrates 6, 7 to surround a display area. A liquid crystal is sealed off in a gap defined by the glass substrates 6, 7 and the sealing material. A plurality of signal electrodes 8 are formed in parallel on one surface of the glass substrate 6 facing the glass substrate 7. On one surface of the glass substrate 7 facing the glass substrate 6, a plurality of scanning electrodes 9 are formed to extend in a direction perpendicular to the signal electrodes 8.

In one predetermined side edge (lower side edge in FIG. 5) of the liquid crystal display panel 2, an edge portion of the glass substrate 6 is projected outward (downward in FIG. 5) of a corresponding edge portion of the glass substrate 7, and the projected portion (region where the glass substrate 6 and the glass substrate 7 are not superimposed) constitutes a wiring junction region 6A. Also, in another side edge (left side edge in FIG. 5) of the liquid crystal display panel 2 which is adjacent to the above one side edge, an edge portion of the glass substrate 7 is projected outward (leftward in FIG. 5) of a corresponding edge portion of the glass substrate 6, and the projected portion constitutes a wiring junction region 7A.

Signal driver IC chips 80A, 80B are mounted in the wiring junction region 6A of the glass substrate 6 by the COG (Chip On Glass) technology. These signal driver IC chips 80A, 80B are connected to output terminals 8A up to which ends of the plurality of signal electrodes 8 are extended, and also to input terminals 810 arrayed along a long edge of the wiring junction region 6A. Further, a scanning driver IC chip 90 is mounted in the wiring junction region 7A of the glass substrate 7 by the COG technology. The scanning driver IC chip 90 is connected to output terminals 9A up to which ends of the plurality of scanning electrodes 9 are extended, and also to input terminals 910 arrayed along a long edge of the wiring junction region 7A.

An output terminal region 11B of the composite flexible wiring board 100 is joined through an anisotropic conductive film (ACF) to the plurality of input terminals 810 arrayed along the long edge of the wiring junction region 6A of the glass substrate 6 for electrical connection therebetween. Likewise, an output terminal region 5A of the flexible wiring board 5 is joined through an anisotropic conductive film to the plurality of input terminals 910 arrayed along the long edge of the wiring junction region 7A of the glass substrate 7. Additionally, in FIG. 5, symbol 11A denotes an input terminal region of the composite flexible wiring board 100, and symbol 5B denotes an input terminal region of the flexible wiring board 5.

Figure 14:
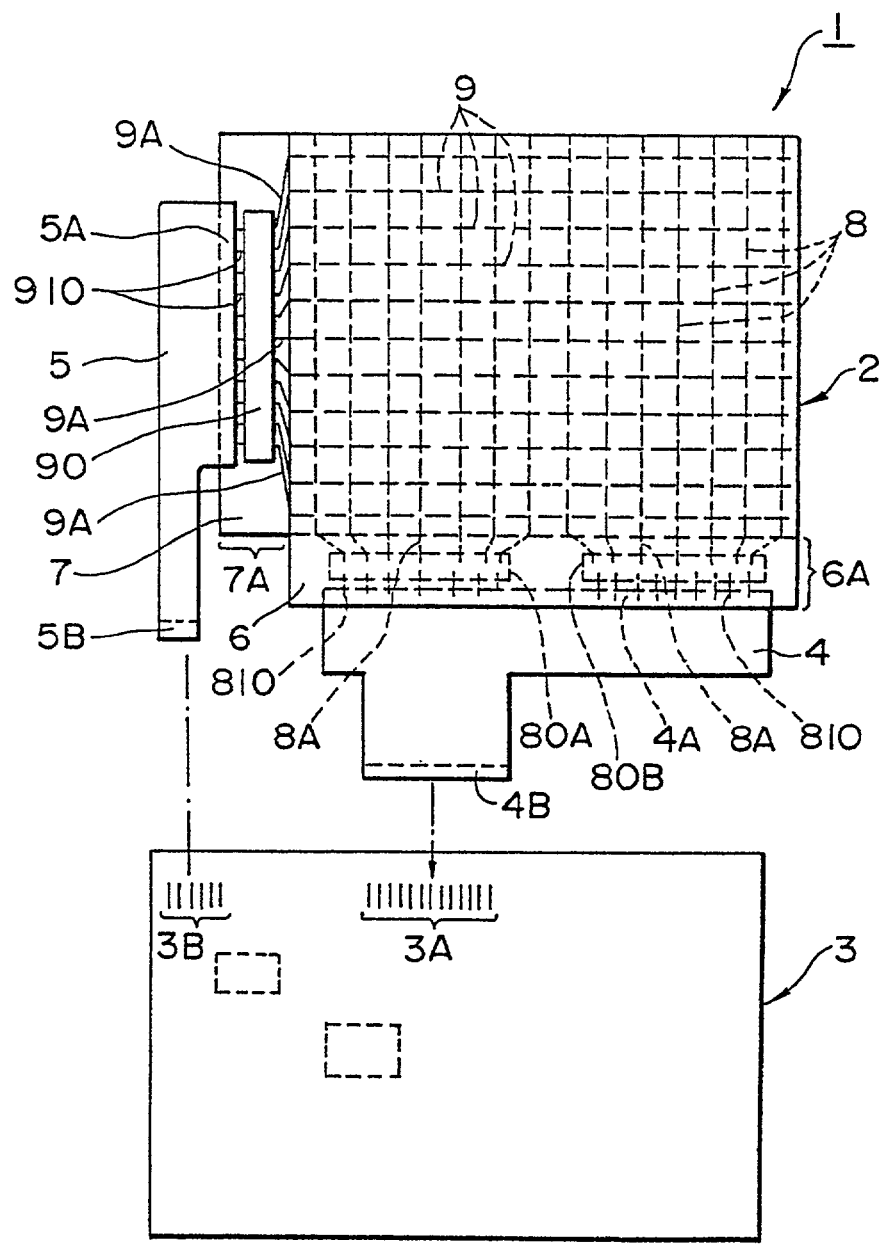
FIG. 14 is a plan view schematically showing one example of conventional liquid crystal display devices.

In the electro-optical device 1000 according to this embodiment, since the composite flexible wiring board 100 is employed, the electronic parts for controlling and operating the liquid crystal display panel 2 can be mounted on the composite flexible wiring board 100. The printed board 3 used in the conventional device, shown in FIG. 14, is no longer required.

Thus, with the electro-optical device according to the present invention, since the composite flexible wiring board according to the present invention is included and mounts thereon the power IC and other electronic parts for controlling and operating the liquid crystal display panel 2, there is no need of employing a printed board on which those electronic parts are mounted. As compared with such a rigid printed board, therefore, the thickness of the liquid crystal display device 1000 can be much reduced. It is hence possible to achieve a reduction in size, thickness and weight of the liquid crystal display device.

Figure 7:
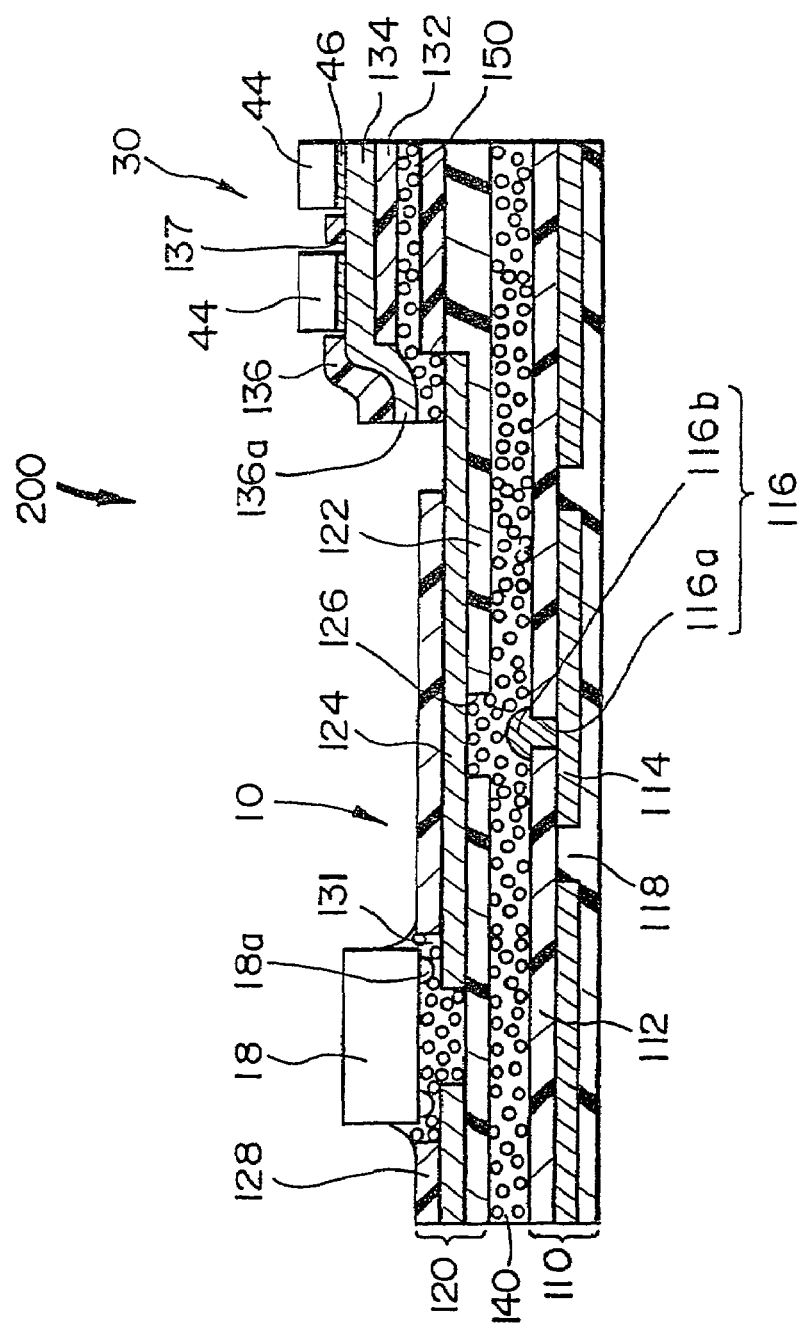
FIG. 7 is a sectional view schematically showing a composite flexible wiring board according to a third embodiment of the present invention.

FIG. 7 is a sectional view schematically showing a modification of the layered structure of the composite flexible wiring board according to the present invention. In the following description of this third embodiment, components having essentially the same functions as those of the composite flexible wiring board 100 of the first embodiment shown in FIGS. 1 to 3 are denoted by the same symbols. FIG. 7 corresponds to FIG. 3.

A composite flexible wiring board 200 according to this embodiment comprises a first flexible wiring board 10 having two wiring layers, and a second flexible wiring board 30 having one wiring layer.

The first flexible wiring board 10 comprises a first single-sided flexible board 110, a second single-sided flexible board 120, and an anisotropic conductive layer 140 is interposed between the first single-sided flexible board 110 and the second single-sided flexible board 120. As with the first embodiment, the first flexible wiring board 10 has the same planar shape as the overall planar shape of the composite flexible wiring board 200, and also includes an input terminal region and an output terminal region (both not shown).

The first single-sided flexible board 110 comprises a base 112 being dielectric and flexible, and a wiring layer 114 having a predetermined pattern and formed on a lower surface of the base 112. An insulating layer 118 is formed on the lower side of the base 112 so as to cover the wiring layer 114. Further, in a predetermined area of the base 112, a hole is formed for constituting a contact portion. A conductive layer 116a is formed in the hole, and a bump 116b is formed on the conductive layer 116a. A contact portion 116 is constituted by both the conductive layer 116a and the bump 116b.

Similarly to the first single-sided flexible board 110, the second single-sided flexible board 120 comprises a base 122 being dielectric and flexible, and a wiring layer 124 having a predetermined pattern and formed on the base 122. An insulating layer 128 is also formed on the base 122 so as to cover the wiring layer 124. Further, in a predetermined area of the base 122, a hole 126 is formed for constituting a contact portion. The wiring layer 114 of the first single-sided flexible board 110 and the wiring layer 124 of the second single-sided flexible board 120 are then electrically connected to each other through the contact portion 116 and the anisotropic conductive layer 140.

In the second single-sided flexible board 120, a power IC chip 18 is electrically connected to the wiring layer 124 through an anisotropic conductive layer 131.

The second flexible wiring board 30 is constructed as a single-sided flexible board on which surface-mounted parts 44 are provided. More specifically, the second flexible wiring board 30 comprises a base 132 being dielectric and flexible, and a wiring layer 134 having a predetermined pattern and formed on the base 132. An insulating layer 136 is also formed on the base 132 so as to cover the wiring layer 134. Further, in a predetermined area of the insulating layer 136, a mount hole 137 is formed for surface mounting of a part. The surface-mounted parts 44 are each disposed in the mount hole 137 and electrically connected to the wiring layer 134 through a solder layer 46.

The first flexible wiring board 10 and the second flexible wiring board 30 are joined to each other through an anisotropic conductive layer 150. The wiring layer 124 of the first flexible wiring board 10 and the wiring layer 134 of the second flexible wiring board 30 are then electrically connected to each other through an interlayer contact portion constituted by the anisotropic conductive layer 150, which is formed in a predetermined position, e.g., a terminal portion 136a in the example shown in FIG. 7.

With the composite flexible wiring board 200 of this embodiment, similar working advantages to those with the composite flexible wiring board of the first embodiment can be obtained.

Figure 8:
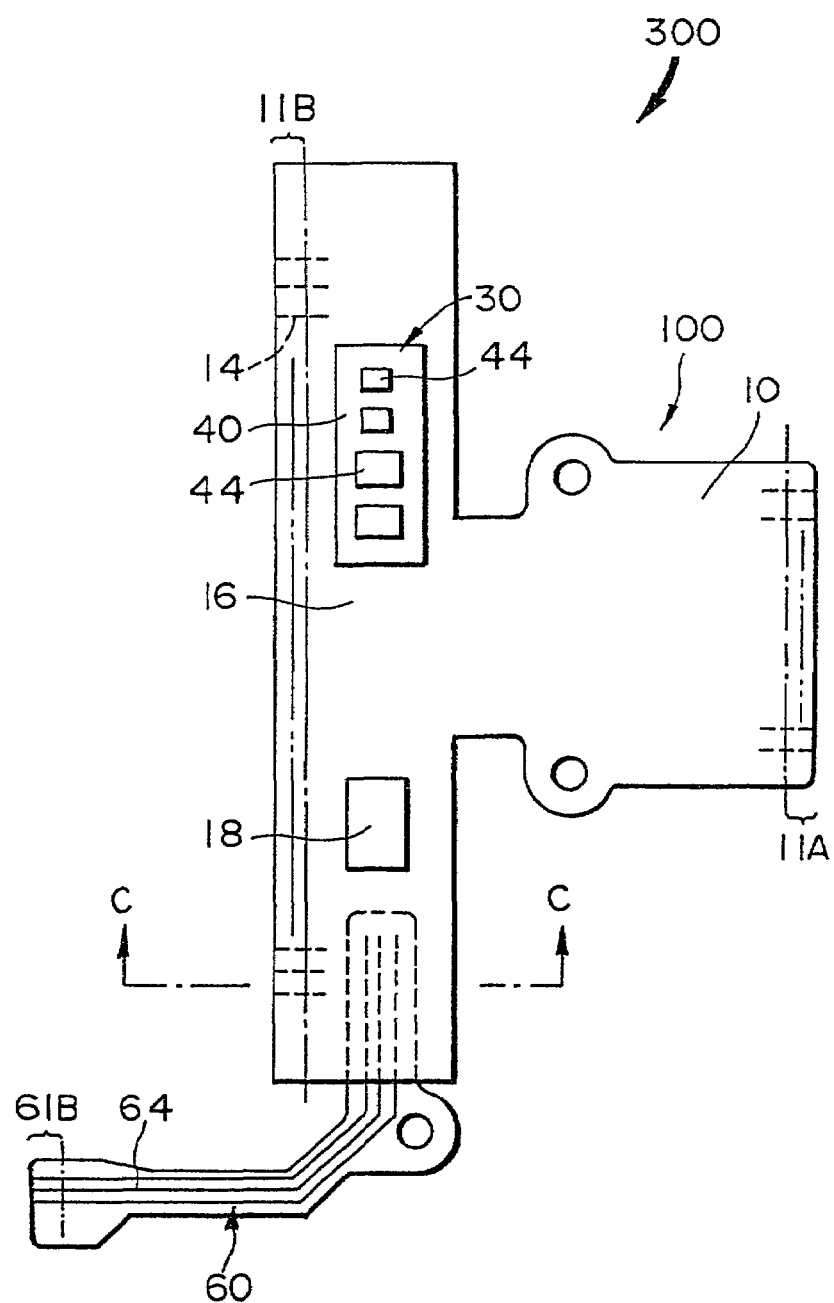
FIG. 8 is a plan view schematically showing a composite flexible wiring board according to a fourth embodiment of the present invention.
Figure 9:
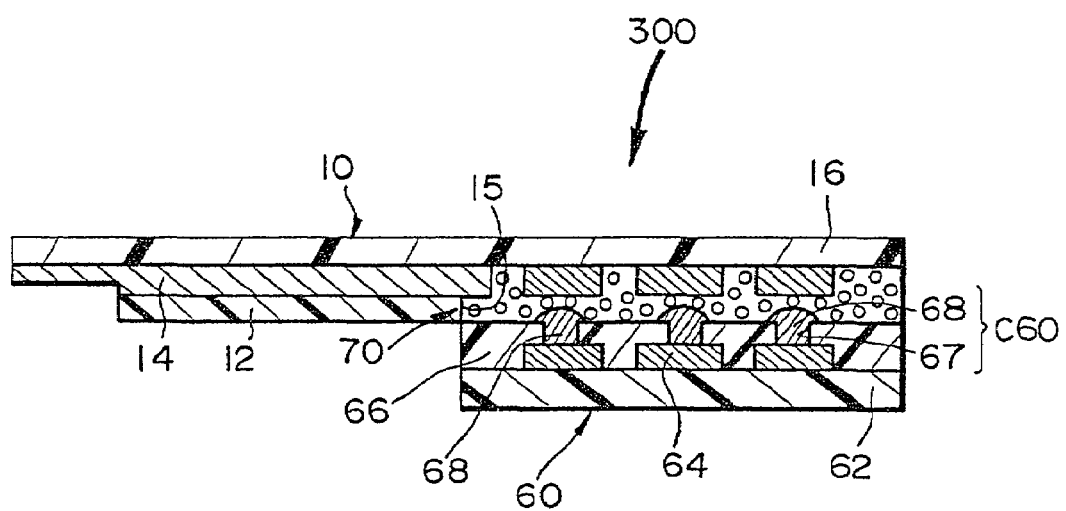
FIG. 9 is a schematic sectional view taken along line C—C in FIG. 8.

FIGS. 8 and 9 show a modification of the composite flexible wiring board according to the present invention. FIG. 8 is a plan view schematically showing a composite flexible wiring board 300, and FIG. 9 is a schematic sectional view taken along line C—C in FIG. 8. Components in this fourth embodiment having essentially the same functions as those of the composite flexible wiring board 100 described above are denoted by the same symbols and a detailed description thereof is omitted here.

The composite flexible wiring board 300 of this fourth embodiment is constructed by joining an additional single-sided flexible wiring board 60 to the composite flexible wiring board 100 of this first embodiment. The single-sided flexible wiring board 60 constitutes a branched wiring unit and has a second output terminal region 61B formed at its free end.

Next, a sectional structure of a joint portion between the composite flexible wiring board 300 and the single-sided flexible wiring board 60 will be described with reference to FIG. 9.

A first flexible wiring board 10 comprises a base 12 being dielectric and flexible, and a wiring layer 14 having a predetermined pattern and formed on the base 12. An insulating layer 16 is also formed on the base 12 so as to cover the wiring layer 14. Further, in a predetermined area of the base 12, a hole 15 is formed for constituting a contact portion. The hole 15 is formed by removing a part of the base 12 such that a corresponding part of the wiring layer 14 is exposed.

The single-sided flexible wiring board 60 comprises a base 62 being dielectric and flexible, and a wiring layer 64 having a predetermined pattern and formed on the base 62. An insulating layer 66 is also formed on the base 62 so as to cover the wiring layer 64. Further, in a predetermined area of the insulating layer 66, a hole 67 is formed for constituting a contact portion C60. The hole 67 is formed by removing a part of the insulating layer 66 such that a corresponding part of the wiring layer 64 is exposed. Within the hole 67, a bump 68 is formed to constitute the contact portion C60. It is desired that the bump 68 be formed to locate projecting above an upper surface of the insulating layer 66.

The first flexible wiring board 10 and the single-sided flexible wiring board 60 are arranged with the wiring layers 14 and 64 positioned to face each other. The first flexible wiring board 10 and the single-sided flexible wiring board 60 are then joined to each other through an anisotropic conductive layer 70. The anisotropic conductive layer 70 establishes electrical connection between the wiring layer 14 of the first flexible wiring board 10 and the contact portion 60C of the single-sided flexible wiring board 60.

With the composite flexible wiring board 300 thus constructed, since electrical connection to two terminal regions of a device as a connection target (e.g., an electro-optical device described below) can be made by using one piece of the composite flexible wiring board 300, a more compact wiring structure can be obtained in addition to the above-described working advantages of the composite flexible wiring board 100. Stated otherwise, when the composite flexible wiring board 300 is applied to an electro-optical device, for example, the output terminal region 11B of the first flexible wiring board 10 can be used for signal wiring of the electro-optical device, and the output terminal region 61B of the single-sided flexible wiring board 60 can be used for scanning wiring of the electro-optical device.

Figure 10:
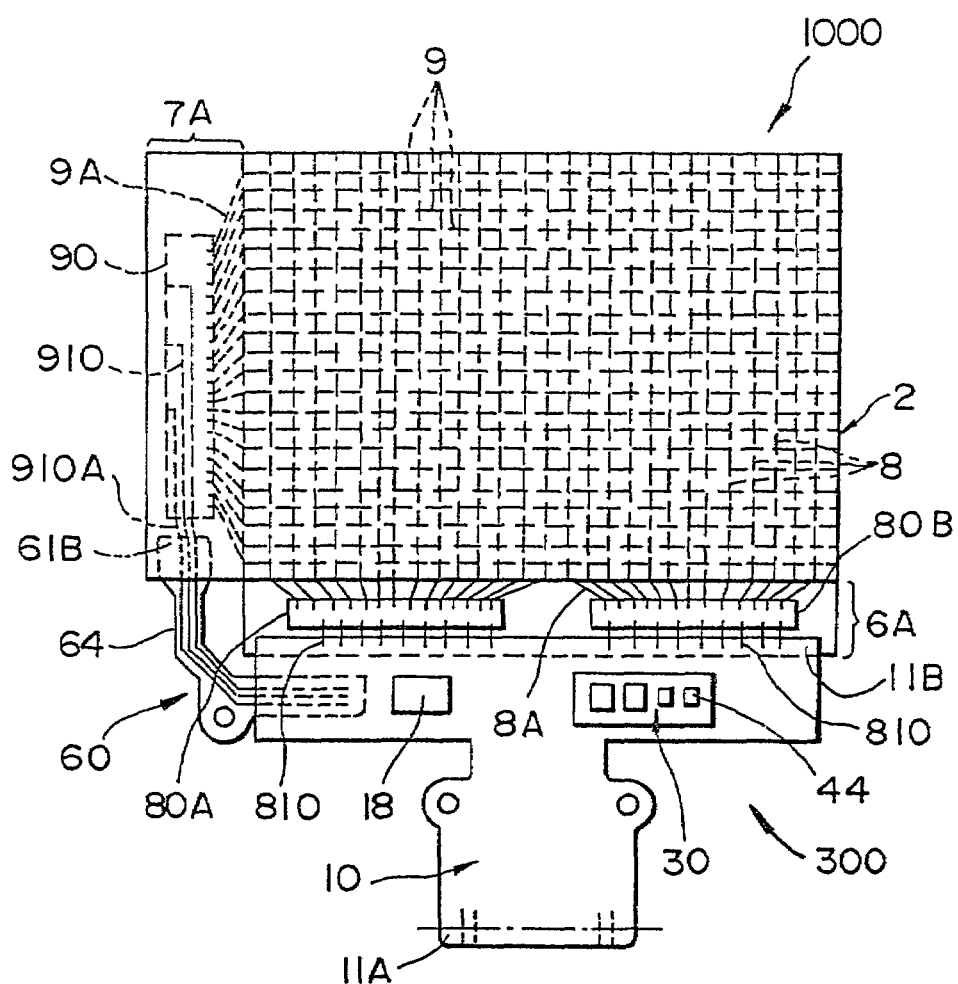
FIG. 10 is a plan view schematically showing a liquid crystal display device as one example of electro-optical devices according to a fifth embodiment of the present invention.

In a fifth embodiment, a description will be made of a liquid crystal display device as one example of electro-optical devices to which the flexible wiring board according to the present invention is applied. FIG. 10 is a plan view schematically showing a liquid crystal display device 1000 according to this embodiment. Components in the liquid crystal display device 1000 shown in FIG. 10, which have essentially the same functions as those of the liquid crystal display device 1000 (see FIG. 5) according to the second embodiment, are denoted by the same symbols and a detailed description thereof is omitted here.

The liquid crystal display device 1000 of this embodiment uses the composite flexible wiring board 300 according to the fourth embodiment.

The liquid crystal display device 1000 of this embodiment differs from that of the second embodiment in structure of wiring junction in a second wiring junction region 7A.

More specifically, an input terminal section 910A of a scanning driver IC chip 90 is routed in the second wiring junction region 7A such that the input terminal section 910A is extended up to an end of the single-sided flexible wiring board 60. To this end, in this embodiment, the input terminal section 910A is preferably arranged in the second wiring junction region 7A so as to extend in a direction perpendicular to scanning electrodes 9, i.e., a direction parallel to signal electrodes 8. This arrangement of the input terminal section 910A enables the single-sided flexible wiring board 60 to be connected along a short side of the second wiring junction region 7A. As compared with the liquid crystal display device 1000 of the second embodiment shown in FIG. 5, therefore, it is possible to cut down a dimension corresponding to a spacing between the scanning driver IC chip 90 and the output terminal region SA of the flexible wiring board 5, and a fold allowance necessary for bending the flexible wiring board 5. As a result, an area rate of the display area with respect to the overall surface of the liquid crystal display panel 2 can be increased.

With the liquid crystal display device 1000 according to this embodiment, the display area of the liquid crystal display panel 2 can be further increased in addition to the working advantages of the liquid crystal display device 1000 according to the second embodiment.

Figure 11:
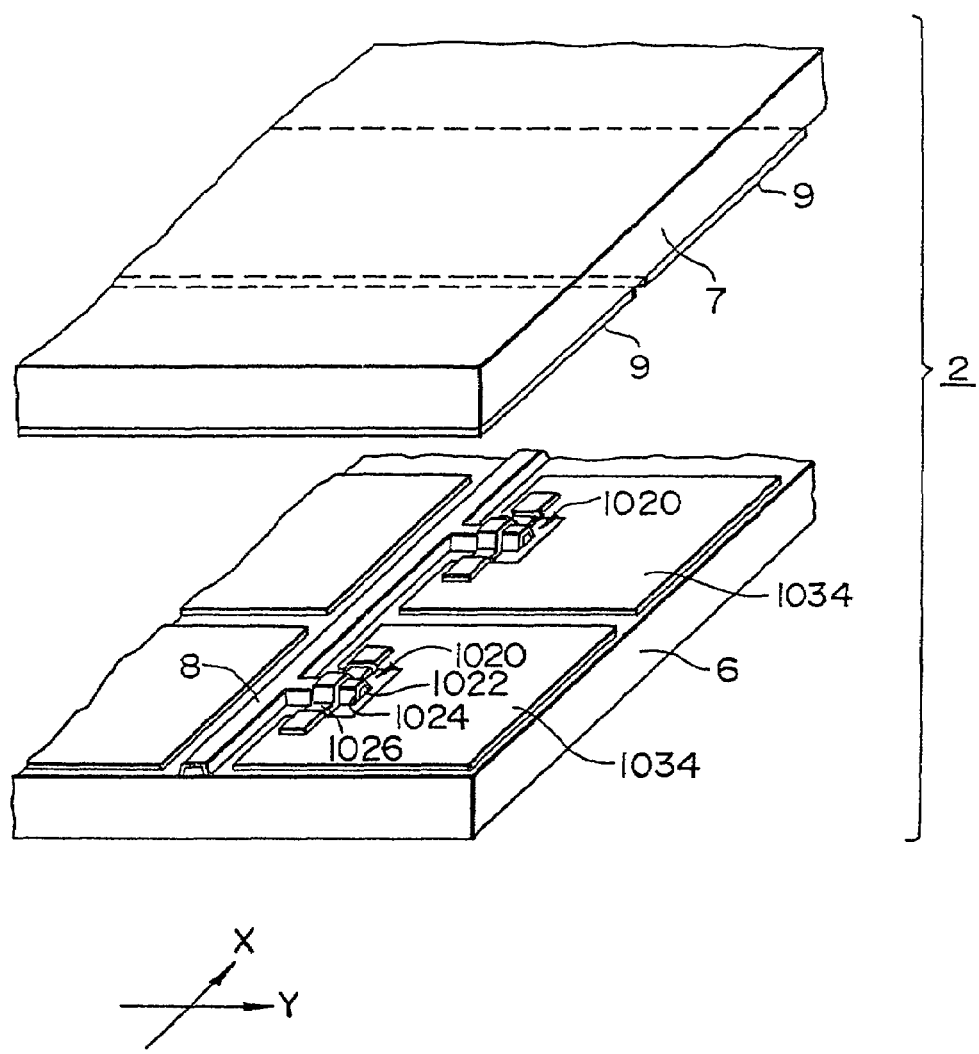
FIG. 11 is a perspective view schematically showing a liquid crystal display panel that constitutes a liquid crystal display device according to a sixth embodiment of the present invention.
Figure 1:
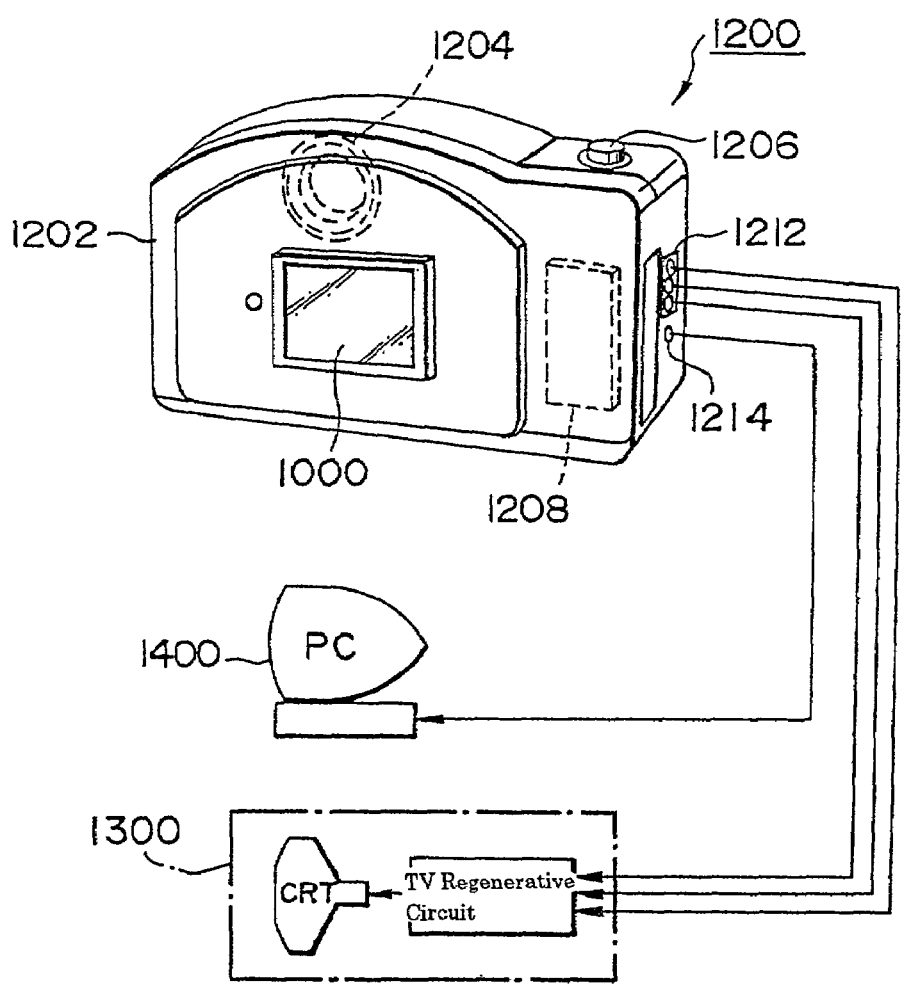

FIG. 11 shows a modification of the liquid crystal display panel 2. Components in FIG. 11 having essentially the same functions as those in FIG. 5 are denoted by the same symbols and a detailed description thereof is omitted here.

In the liquid crystal display panel shown in FIG. 5, the composite flexible wiring board of the present invention is applied to, by way of example, a liquid crystal display panel of the passive matrix addressing type. The composite flexible wiring board of the present invention is however also applicable to a liquid crystal display panel of the active matrix addressing type employing TFD devices as switching devices for pixel electrodes.

A first wiring junction region 6A and a second wiring junction region 7A have the same structure as those of the liquid crystal display panel shown in FIG. 5, and therefore FIG. 11 shows the internal structure inside a sealing material.

A liquid crystal display panel 2 comprises a first substrate 6 and a second substrate 7 arranged in opposite relation to face each other. A sealing material (not shown) is interposed between the first and second substrates 6, 7 to surround a display area. A liquid crystal layer (not shown) is sealed off in an area defined by the first and second substrates 6, 7 and the sealing material. The first and second substrates 6, 7 are each formed of, for example, a glass or plastic substrate.

Further, a plurality of pixel electrodes 1034 in a matrix pattern and a plurality of signal electrodes 8 each extending in the X-direction are arranged on one surface of the first substrate 6 facing the second substrate 7. The pixel electrodes 1034 of one row are all connected in common to a single line of the signal electrode 8 through respective TFD devices 1020. The pixel electrode 1034 is made of an conductive material, such as ITO (Indium Tin Oxide), which is transparent to the display light. The TFD device 1020 has a metal/insulator/metal sandwiched structure comprising a first metal film 1022, an oxide film 1024 formed by anodization of the first metal film 1022, and a second metal film 1026 in this order as viewed from the side of the first substrate 6. The TFD device 1020 therefore has a diode switching characteristic in positive and negative two-way directions.

On the other hand, a plurality of scanning electrodes 9 are arranged on one surface of the second substrate 7 facing the first substrate 6. The scanning electrodes 9 are extended parallel to each other at a predetermined spacing between them in a predetermined direction (Y-direction in FIG. 11) perpendicular to the signal electrodes 8, and are arrayed to serve as opposing electrodes to the pixel electrodes 1034. Though not shown in FIG. 11, a color filter is provided in one-to-one relation to each area where the scanning electrode 9 and the pixel electrode 1034 intersect.

Further, as with the second embodiment shown in FIG. 5, the liquid crystal display panel 2 has the first wiring junction region 6A and the second wiring junction region 7A located respectively along two sides thereof which are adjacent to each other. Therefore, the composite flexible wiring board of the present invention, e.g., any one of the composite flexible wiring boards according to the first, third and fourth embodiments, can be connected to the liquid crystal display panel 2.

Examples of electronic equipment each using a liquid crystal display device, as the electro-optical device according to the present invention, will be described below.

(1) Digital Still Camera

A description is made of a digital still camera in which a liquid crystal display device according to the present invention is employed as a finder. FIG. 12 is a perspective view showing a construction of the digital still camera, the view also illustrating connection to external devices in the simplified form.

While in an ordinary camera a film is exposed to a light image of an object to be photographed, a digital still camera 1200 produces an image pickup signal through photoelectric conversion of a light image of an object to be photographed by using an image pickup device such as a CCD (Charge Coupled Device). A liquid crystal display panel employing the above-described liquid crystal display device 1000 is disposed on the rear side (front side as viewed in FIG. 12) of a case 1202 of the digital still camera 1200 and displays an image in accordance with the image pickup signal from the CCD. Thus, the liquid crystal display device 1000 functions as a finder for displaying an image of the object. Also, a light receiving unit including an optical lens, the CCD, etc. is disposed on the front side (rear side as viewed in FIG. 12) of the case 1202.

When a photographer confirms an object image displayed on the liquid crystal display device 1000 and depresses a shutter button 1206, the image pickup signal outputted from the CCD at that time is transferred to and stored in a memory on a circuit board 1208. Further, in the digital still camera 1200, a video signal output terminal 1212 and an input/output terminal 1214 for data communication are provided in a side surface of the case 1202. Then, as shown in FIG. 12, a TV monitor 1300 is connected to the former video signal output terminal 1212 and a personal computer 1400 is connected to the latter input/output terminal 1214 for data communication, as needed. Additionally, the image pickup signal stored in the memory on the circuit board 1208 is outputted to the TV monitor 1300 or the personal computer 1400 in response to a predetermined operation.

(2) Cellular Phone and Other Electronic Equipment

FIGS. 13(A), 13(B) and 13(C) are appearance views showing other examples of electronic equipment in which a liquid crystal display device is used as the electro-optical device according to the present invention. FIG. 13(A) shows a cellular phone 3000 including the liquid crystal display device 1000 provided in a front upper portion thereof. FIG. 13(B) shows a wristwatch 4000 including a display unit that is disposed in a front central portion of a body and employs the liquid crystal display device 1000. FIG. 13(C) shows a portable information tool 5000 comprising a display unit, which is constituted by the liquid crystal display device 1000, and an input unit 5100.

Though not shown, each of those electronic equipment is constructed by including, in addition to the liquid crystal display device 1000, a display signal producing unit that comprises various circuits such as a display information output source, a display information processing circuit and a clock generating circuit, a power supply circuit for supplying electrical power to those circuits, etc. In the portable information tool 5000, for example, a display image is formed on the display unit when a display signal produced by the display signal producing unit in accordance with information, etc. entered through the input unit 5100 is supplied to the liquid crystal display device 1000.

Examples of the electronic equipment, in which the liquid crystal display device 1000 according to the present invention is incorporated, are not limited to a digital still camera, cellular phone, wristwatch, and portable information tool, but may include other various pieces of equipment such as an electronic notepad, a pager, a POS terminal, an IC card, a minidisk player, a liquid crystal projector, a personal computer (PC) and an engineering workstation (EWS) adapted for multimedia systems, an notebook personal computer, a word processor, a TV set, a video cassette recorder employing a view finder or a direct-view monitor, an electronic calculator, a car navigation device, devices having a touch panel, and a clock.

Also, examples of the liquid crystal display panel may include, in terms of driving scheme, a simple-matrix liquid crystal display panel and a static-driving liquid crystal display panel in which no switching device is provided in the panel itself, and an active-matrix liquid crystal display panel which employs 3-terminal switching devices represented by TFTs (Thin Film Transistors) or 2-terminal switching devices represented by TFDs (Thin Film Diodes). In terms of electro-optical characteristics, examples of the liquid crystal display panel may include various types of panels, including TN, STN, guest host, phase transition, and ferrodielectric types.

Figure 15:
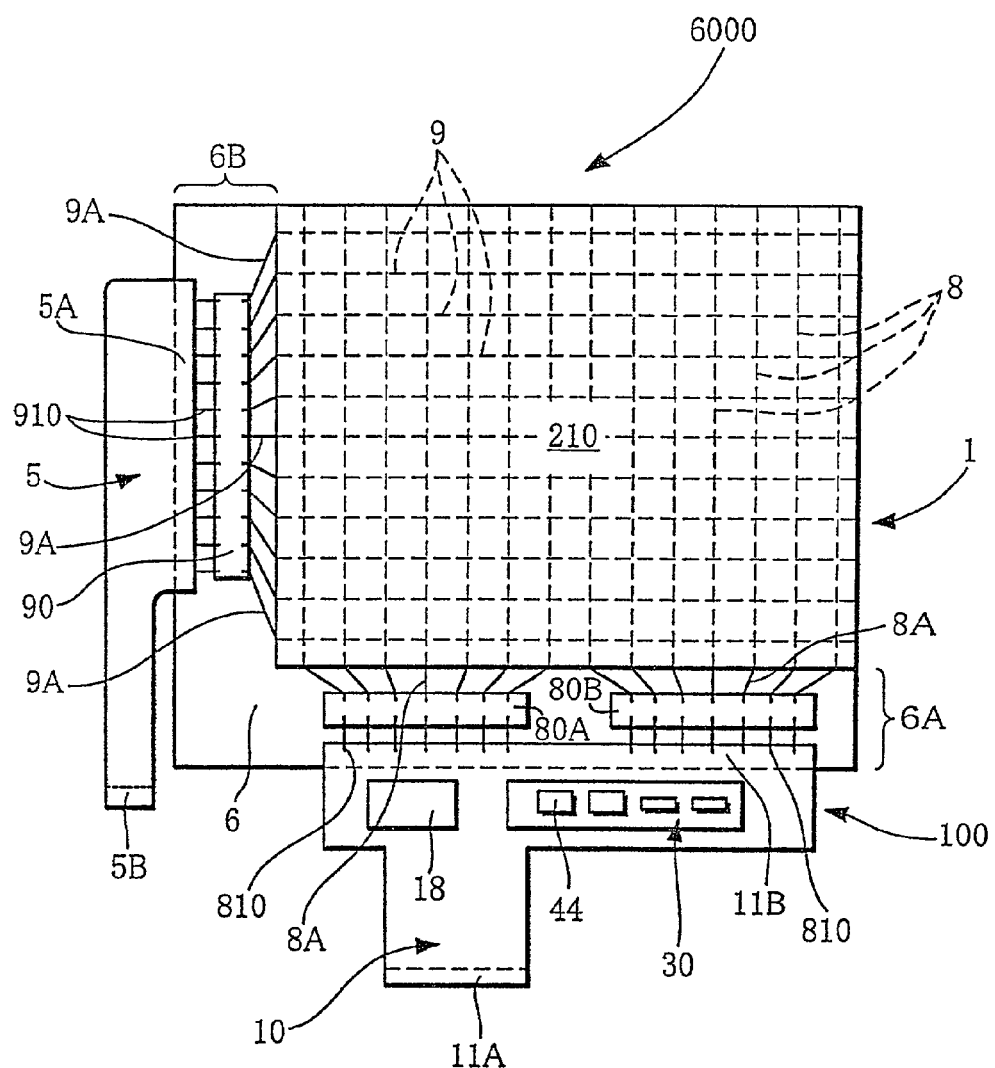
FIG. 15 is a plan view schematically showing an EL display device as one example of electro-optical devices according to an eighth embodiment of the present invention.

In an eighth embodiment, a description will be made of an EL display device as one example of electro-optical devices to which the flexible wiring board according to the present invention is applied. FIG. 15 is a plan view schematically showing an EL display device 6000 according to this embodiment.

The EL display device 6000 comprises an EL display panel 21, a composite flexible wiring board 100 according to the present invention, and a known flexible wiring board 5. In the example shown in FIG. 15, the composite flexible wiring board 100 is the same as that according to the first embodiment. Therefore, components having the same functions as those of the composite flexible wiring board 100 according to the first embodiment are denoted by the same symbols and a detailed description thereof is omitted here. As a matter of course, any of the composite flexible wiring boards according to the third and fourth embodiments may also be used in this embodiment.

The EL display panel 21 includes an organic EL structure 210 formed on a substrate 6. The organic EL structure 210 has a layered structure comprising, though not shown, a hole transport layer, a luminescent layer, an electron transport layer, and a protective layer, if needed, which are formed in laminated fashion. A plurality of signal electrodes 8 are formed in parallel on a lower surface of the organic EL structure 210 (i.e., on an upper surface of the substrate 6), and a plurality of scanning electrodes 9 are formed on an upper surface of the organic EL structure 210 to extend in a direction perpendicular to the signal electrodes 8.

One predetermined edge portion (lower edge portion in FIG. 15) of the EL display panel 21 constitutes a first wiring junction region 6A. Also, another edge portion (left edge portion in FIG. 15) of the EL display panel 21, which is adjacent to the above one edge portion, constitutes a second wiring junction region 6B.

Signal driver IC chips 80A, 80B are mounted in the first wiring junction region 6A by the COG (Chip On Glass) technology. These signal driver IC chips 80A, 80B are connected to output terminals 8A up to which ends of the plurality of signal electrodes 8 are extended, and also to input terminals 810 arrayed along a long edge of the first wiring junction region 6A. Further, a scanning driver IC chip 90 is mounted in the second wiring junction region 6B by the COG technology. The scanning driver IC chip 90 is connected to output terminals 9A up to which ends of the plurality of scanning electrodes 9 are extended, and also to input terminals 910 arrayed along a long edge of the second wiring junction region 6B.

An output terminal region 11B of the composite flexible wiring board 100 is joined through an anisotropic conductive film (ACF) to the plurality of input terminals 810 arrayed along the long edge of the first wiring junction region 6A of the substrate 6 for electrical connection therebetween. Likewise, an output terminal region 5A of the flexible wiring board 5 is joined through an anisotropic conductive film to the plurality of input terminals 910 arrayed along the long edge of the second wiring junction region 6B of the substrate 6. Additionally, in FIG. 15, symbol 11A denotes an input terminal region of the composite flexible wiring board 100, and symbol 5B denotes an input terminal region of the flexible wiring board 5.

In the EL display device 6000 according to this embodiment, since the composite flexible wiring board 100 is employed, the electronic parts for controlling and operating the EL display panel 21 can be mounted on the composite flexible wiring board 100.

Thus, with the electro-optical device according to the present invention, since the composite flexible wiring board according to the present invention is included and mounts thereon the power IC and other electronic parts for controlling and operating the EL display panel 21, there is no need of employing a rigid printed board on which those electronic parts are mounted. As compared with such a rigid printed board, therefore, the thickness of the EL display device 6000 can be much reduced. It is hence possible to achieve a reduction in size, thickness and weight of the EL display device.

While the present invention has been described above in connection with devices according to several specific embodiments, the present invention can be modified in various ways within the scope of the invention. In the above-described embodiments, a liquid crystal display device and an EL display device are employed, by way of example, as an image display means (electro-optical display unit) of an electro-optical device. However, the present invention is not limited to those examples, but may also be applicable to other various types of electro-optical means such as a small-sized TV set using, e.g., a thin cathode-ray tube or a liquid crystal shutter, a plasma display, a CRT display, and an FED (Field Emission Display) panel.

What is claimed is:

1. An electro-optical device comprising:
   a first substrate:
   a second substrate opposite the first substrate, the second substrate having a projected portion that projects outward further than an edge of the first substrate;
   an electro-optical material disposed between the first substrate and the second substrate;

a driver IC chip mounted on the projected portion of the second substrate using Chip On Glass technology;

a wiring junction region provided on the projected portion of the second substrate, the wiring junction region being electrically connected to the IC chip;

a first flexible wiring board mounted to the projected portion of the second substrate and in electrical connection with the wiring junction region;

a power IC chip mounted on the first flexible wiring board;

a second flexible wiring board disposed on the first flexible wiring board at a position inboard of the first flexible wiring board;

an interlayer contact portion that electrically connects the first flexible wiring board and the second flexible wiring board together; and a surface-mounted component mounted on the second flexible wiring board.

2. The electro-optical device according to claim 1, wherein said first flexible wiring board has an input terminal region and an output terminal region.

3. The electro-optical device according to claim 1, wherein said surface-mounted component comprises at least one of a flat-packaged LSI, a resistor, a capacitor, an inductance, a diode, a transistor, a quartz oscillator, and a connector.

4. The electro-optical device according to claim 1, wherein said power IC chip is connected to a conductive layer through an anisotropic conductive film.

5. The electro-optical device according to claim 1, wherein said surface-mounted part is connected to an conductive layer through a solder layer.

6. The electro-optical device according to claim 1, wherein said interlayer contact portion comprises at least one of an anisotropic conductive film and solder.

7. The electro-optical device according to claim 1, further comprising a third flexible wiring board connected to said first flexible wiring board, said third flexible wiring board having an output terminal region.

8. The electro-optical device according to claim 1, wherein said electro-optical material includes an EL display panel having an electroluminescence structure formed on said second substrate.

* * * * *